(12) United States Patent
Bennett

(10) Patent No.: US 8,093,900 B2
(45) Date of Patent: Jan. 10, 2012

(54) ULTRA WIDE BAND WIRELESS RADIO TRANSMISSION IN MRI SYSTEMS INVOLVING CHANNEL ESTIMATION

(75) Inventor: Jeffie K. Bennett, Dresden (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 505 days.

(21) Appl. No.: 12/302,323

(22) PCT Filed: May 9, 2007

(86) PCT No.: PCT/US2007/068520
§ 371 (c)(1),
(2), (4) Date: Nov. 25, 2008

(87) PCT Pub. No.: WO2007/140088
PCT Pub. Date: Dec. 6, 2007

(65) Prior Publication Data
US 2009/0140739 A1    Jun. 4, 2009

Related U.S. Application Data

(60) Provisional application No. 60/803,163, filed on May 25, 2006.

(51) Int. Cl.
*G01V 3/00* (2006.01)
(52) U.S. Cl. ......... 324/322; 324/318; 324/307; 324/309
(58) Field of Classification Search .......... 324/300–322; 600/407–435; 382/128–131; 455/456.1, 455/426.1; 378/5
See application file for complete search history.

(56) References Cited

U.S. PATENT DOCUMENTS

| | | | |
|---|---|---|---|
| 5,245,288 A | 9/1993 | Leussler | |
| 6,249,252 B1 * | 6/2001 | Dupray | 342/450 |
| 6,380,741 B1 | 4/2002 | Hajnal et al. | |
| 6,961,604 B1 | 11/2005 | Vahasalo et al. | |
| 7,323,876 B2 * | 1/2008 | Den Boef | 324/322 |
| 7,750,635 B2 * | 7/2010 | Van Helvoort et al. | 324/318 |

(Continued)

FOREIGN PATENT DOCUMENTS

EP    1441458 A1    7/2004

(Continued)

OTHER PUBLICATIONS

Al-Susa, E. A., et al.; An Improved Channel Inversion Based Adaptive OFDM System in the Presence of Channel Errors and Rapid Time Variations; 2000; IEEE Trans. on Vehicular Technology Conference; vol. 3; 1114-1119.

(Continued)

*Primary Examiner* — Melissa Koval
*Assistant Examiner* — Tiffany Fetzner

(57) ABSTRACT

At least one radio frequency coil (28, 30) is disposed within an examination region (14), the radio frequency coil (28, 30) wirelessly receives a spread spectrum calibration signal from and transmits multiple channels of data in spread spectrum data signals to an associated wireless transceiver (60, 64; 62, 66). A channel estimator (104, 106) estimates frequency dependent signal strength characteristics based on the calibration signal between the wireless transceiver (60, 64; 62, 66) and the associated coil (28, 30). A signal strength adjuster (108, 110) makes a frequency dependent adjustment to the data signals strengths such that the transmitted data signals are compensated based on the estimated signal characteristics from the received calibration signal to create frequency dependent compensated data signals.

20 Claims, 4 Drawing Sheets

U.S. PATENT DOCUMENTS

| | | | |
|---|---|---|---|
| 7,783,096 B2 * | 8/2010 | Chen et al. | 382/128 |
| 2001/0051766 A1 * | 12/2001 | Gazdzinski | 600/309 |
| 2003/0137966 A1 | 7/2003 | Odman et al. | |
| 2003/0206019 A1 | 11/2003 | Boskamp | |
| 2004/0030713 A1 | 2/2004 | Takano et al. | |
| 2004/0048595 A1 | 3/2004 | Miller et al. | |
| 2004/0170157 A1 | 9/2004 | Kim et al. | |
| 2005/0107681 A1 | 5/2005 | Griffiths | |
| 2005/0195786 A1 | 9/2005 | Shpak | |
| 2006/0244452 A1 * | 11/2006 | Den Boef | 324/322 |
| 2006/0279284 A1 * | 12/2006 | Vaughan | 324/318 |
| 2007/0133736 A1 * | 6/2007 | Chen et al. | 378/5 |
| 2007/0155401 A1 * | 7/2007 | Ward et al. | 455/456.1 |
| 2009/0005061 A1 * | 1/2009 | Ward et al. | 455/456.1 |
| 2009/0061852 A1 * | 3/2009 | Feher | 455/426.1 |
| 2009/0140739 A1 * | 6/2009 | Bennett | 324/318 |
| 2009/0267601 A1 * | 10/2009 | Van Helvoort et al. | 324/318 |

FOREIGN PATENT DOCUMENTS

WO     2005052621 A1     6/2005

OTHER PUBLICATIONS

Bisaglia, P., et al.; Pre-equalization Techniques for Downlink and Uplink TDD MC-CDMA Systems; 2005; Wireless Personal Communications: 35:3-18.

Keller, T., et al.; Sub-band Adaptive Pre-equalised OFDM Transmission; 1999; IEEE Trans. on Vehicular Technology Conference; vol. 1; 334-338.

Kimura, R., et al.; Block-orthogonal Frequency Division Multiplexing in Multi-Path Fading Channel; 2006; Wireless Personal Communications; 38:27-42.

Pruessmann, K. P., et al.; SENSE: Sensitivity Encoding for Fast MRI; 1999; MRM; 42:952-962.

Sethi, M., et al.; Digitising the Wireless MRI Link: A Space-Time CDMA Approach; 2001; IEEE Trans. on 7th Intelligent Information Systems Conf.; pp. 31-35.

Wei, J., et al.; A realization of digital wireless transmission for MRI signals based on 802.11b; 2007; Journal of Magnetic Resonance; 186(2)358-363.

* cited by examiner

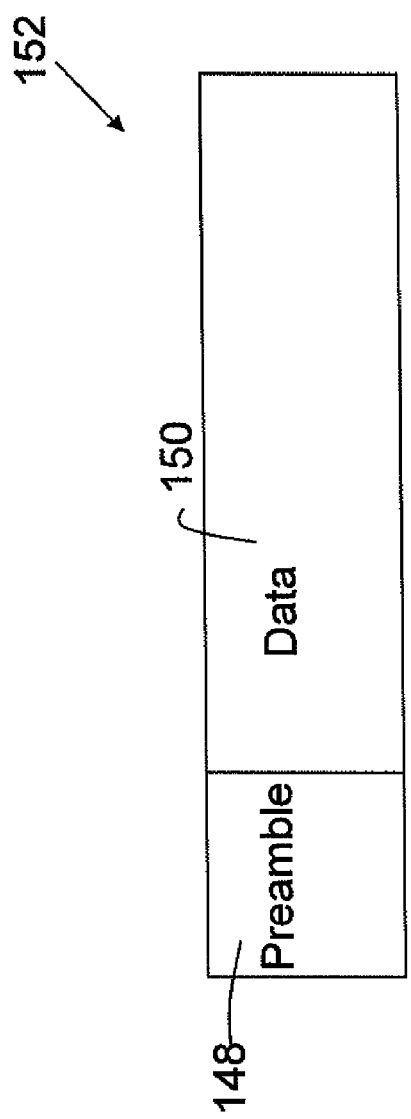

ULTRA WIDE BAND WIRELESS RADIO TRANSMISSION IN MRI SYSTEMS INVOLVING CHANNEL ESTIMATION

CROSS REFERENCE TO RELATED APPLICATIONS

This application claims the benefit of U.S. provisional application Ser. No. 60/803,163 filed May 25, 2006, which is incorporated herein by reference.

The present application relates to the magnetic resonance arts. It finds particular application in conjunction with magnetic resonance imaging employing wireless multiple transmission/reception (e.g. SENSE) coils, and will be described with particular reference thereto. It is to be appreciated, however, that the following may also find application in conjunction with other types of magnetic resonance systems, magnetic resonance spectroscopy systems, and the like.

In the SENSE magnetic resonance imaging technique, a plurality of coil elements is used to acquire simultaneously magnetic resonance imaging data of a common imaging slice or volume. To acquire imaging data quickly using the SENSE technique, each coil element samples different portions of k-space. The undersampled imaging data are reconstructed into corresponding folded images of the slice or volume. The folded images are unfolded based on sensitivity characteristics of the coils to produce an unfolded image of the slice or volume. The SENSE imaging technique is described, for example, in Pruessmann et al., Magnetic Resonance in Medicine 42, pp. 952-962 (1999) and in Hajnal et al., U.S. Pat. No. 6,380,741.

Conventionally, each coil has been connected to the receive and/or transmit channel of the MRI system via a wire line in the connecting cable. Since it is cumbersome and disadvantageous to have cables running from each coil through the examination space of the MR system to the receive and/or transmit channels, various attempts have been made to provide a wireless communication to and from the coils. In such systems, typically, the detected MR signals and/or control signals are transmitted to and from the coils by orthogonal frequency division multiplexing (OFDM) which uses ultra wide band (UWB) radio transmission standard protocol.

A drawback of the wireless MR systems is frequency selective fading. As the bore of the examination space and the RF cage around the scanner of the MR system are highly reflective, increased reflections, diffractions and scattering of signals occur. The reflections from various points in the surroundings partially cancel the transmitted RF signals at certain locations, white at other frequencies, the reflections add to the transmitted RF signal. The cancellation and addition frequencies are not stationary. In addition, to prevent interference with the magnetic resonance signals, the wireless transceivers must transceive at high data rates or frequencies, e.g. over 500 MHz. This leads to a frequency spectrum with amplitude notches (partial cancellation) and spikes (additive).

Typically, the gain of an analog to digital converter (ADC) is set to capture the nominal and stronger signals. Because typical ADCs have only finite number of bits, the signal strength in the notches fall below the "regular" quantization noise and, thus, the faded signals cannot be distinguished and processed. As a result, the OFDM approach could be efficient only for the systems employing analog to digital converters with a high number of bits.

Another problem is that the receivers of the OFDM based system need to be synchronized with a great degree of precision. Typically, a preamble at the beginning of each transmitted data packet is used to allow the receiver to synchronize with the transmitter. A length of the standard preamble is 24 symbols. During the synchronization time period the system is not transmitting and receiving data, e.g. the scanner is idle and, thus, the MRI system throughput is compromised.

The present application provides new and improved methods and apparatuses which overcome the above-referenced problems and others.

In accordance with one aspect, a magnetic resonance system is disclosed. At least one radio frequency coil is disposed within an examination region, the radio frequency coil wirelessly receives a spread spectrum calibration signal from and transmits multiple channels of data in spread spectrum data signals to an associated wireless transceiver. A channel estimator estimates frequency dependent signal strength characteristics based on the calibration signal between the wireless transceiver and an associated coil. A signal strength adjuster makes a frequency dependent adjustment to the data signals strengths such that the transmitted data signals are compensated based on the estimated signal characteristics from the received calibration signal to create frequency dependent compensated data signals.

In accordance with another aspect, a magnetic resonance imaging method is disclosed. A spread spectrum calibration signal between a radio frequency coil and an associated wireless transceiver is wirelessly received. Frequency dependent signal strength characteristics are estimated based on the calibration signal between the wireless transceiver and the coil. Based on the estimate, frequency dependent signal strengths adjustments are made to spread spectrum data signals which carry data acquired in an examination region to create frequency dependent compensated data signals. The compensated data signals are transmitted to the associated wireless transceiver.

In accordance with another aspect, a magnetic resonance system is disclosed. At least one frequency coil is disposed within an examination region, the coil wirelessly receives a spread spectrum calibration signal and transmits spread spectrum data signals to an associated wireless transceiver. A channel estimator estimates signal characteristics based on the calibration signal transmitted between the wireless transceiver and the associated coil. A preamble device adjusts a size of a preamble of each transmitted data packet based on the estimated characteristics of the signals.

One advantage is that transmit power is compensated such that the frequency fading effects are reduced or eliminated.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 4 diagrammatically illustrates a data packet including preamble.

Figure 1:
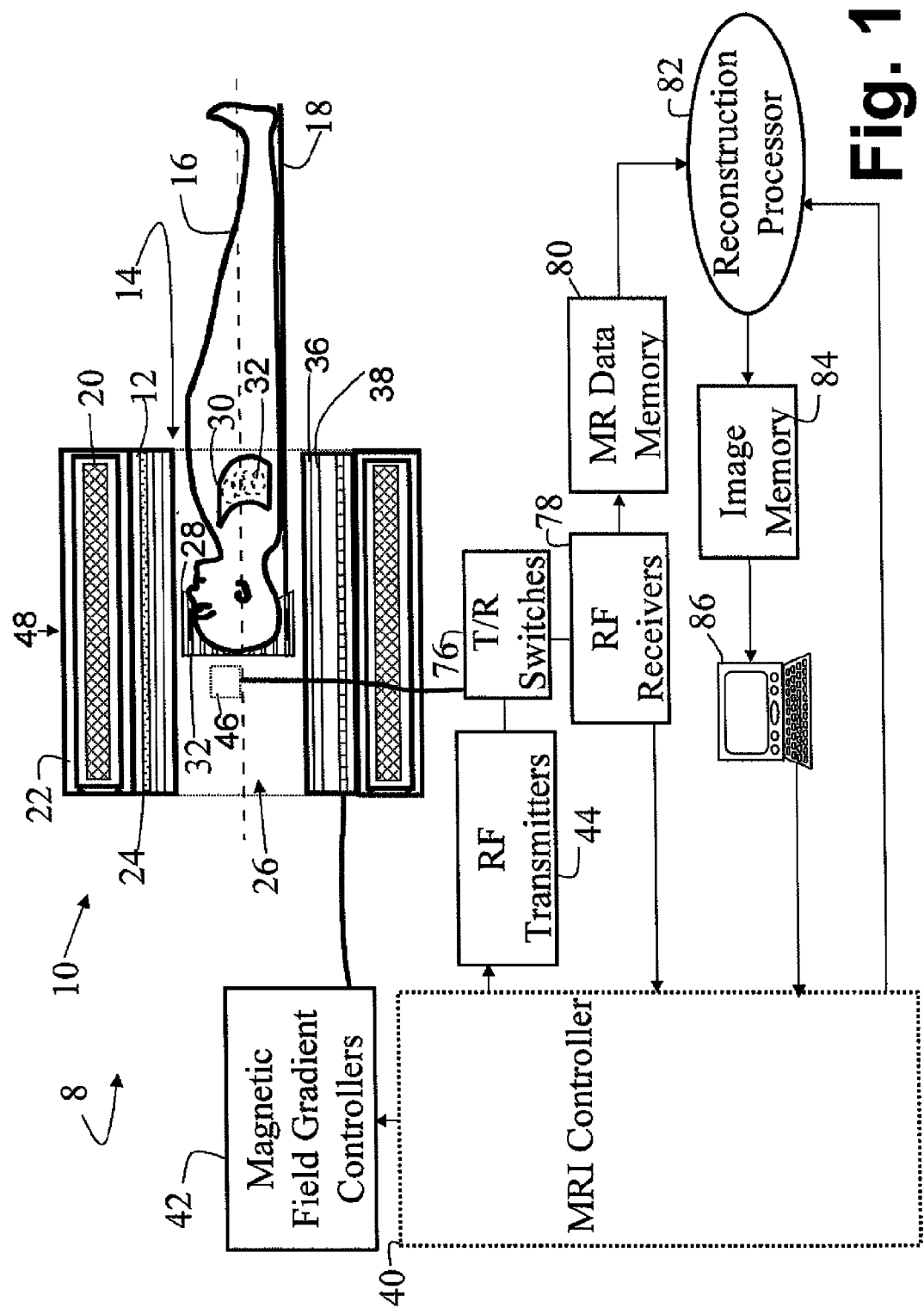
FIG. 1 is a diagrammatic illustration of a magnetic resonance imaging system.

With reference to FIG. 1, a magnetic resonance imaging system 8 includes a scanner 10 including a housing 12 defining an examination region 14, in which a patient or other imaging subject 16 is disposed on a patient support or bed 18. A main magnet 20 disposed in the housing 12 generates a main magnetic field $B_0$ in the examination region 14. Typically, the main magnet 20 is a superconducting magnet surrounded by cryo shrouding 22; however, a resistive or permanent main magnet can also be used. Magnetic field gradient coils 24 are arranged in or on the housing 12 to superimpose selected magnetic field gradients on the main magnetic field within the examination region 14. Although a bore type system is illustrated, open and other types of systems are also contemplated.

An RF coil system or arrangement 26 is disposed about the examination region 14. The coil system 26 includes one or more multiple transmit or receive, e.g. sensitivity encoding (SENSE), or other RF coils disposed inside the examination region 14. In the exemplary embodiment, the coil system 26 includes local first and second SENSE coils, such as a head coil 28 and a surface coil 30, each including a plurality of independent SENSE coil elements 32. A number of coil elements 32 can be four, eight, sixteen, and the like. The coil elements 32 of each of the first and second SENSE coils 28, 30 have different sensitivities to the magnetic resonance signal, thus enabling SENSE encoding. Optionally, the housing 12 further houses or supports a whole body coil 36 for selectively exciting and/or detecting magnetic resonances. The local coils 28, 30 can be used for receiving magnetic resonances that are excited by the optional whole body coil, or the magnetic resonances can be both excited and received by the local coils 28, 30. A shield 38 shields the coils 28, 30, 36 from other elements.

A magnetic resonance imaging controller 40 operates magnetic field gradient controllers 42 coupled to the gradient coils 24 to superimpose selected magnetic field gradients on the main magnetic field in the examination region 14 and also operates radio frequency (RF) transmitters or transmitting channels 44 coupled to the one or more coils 28, 30, 36 to inject selected radio frequency excitation pulses at about the magnetic resonance frequency into the examination region 14 for imaging. In multi transmit systems each coil element 32 has a corresponding transmitter or transmit channel 44.

Figure 2:
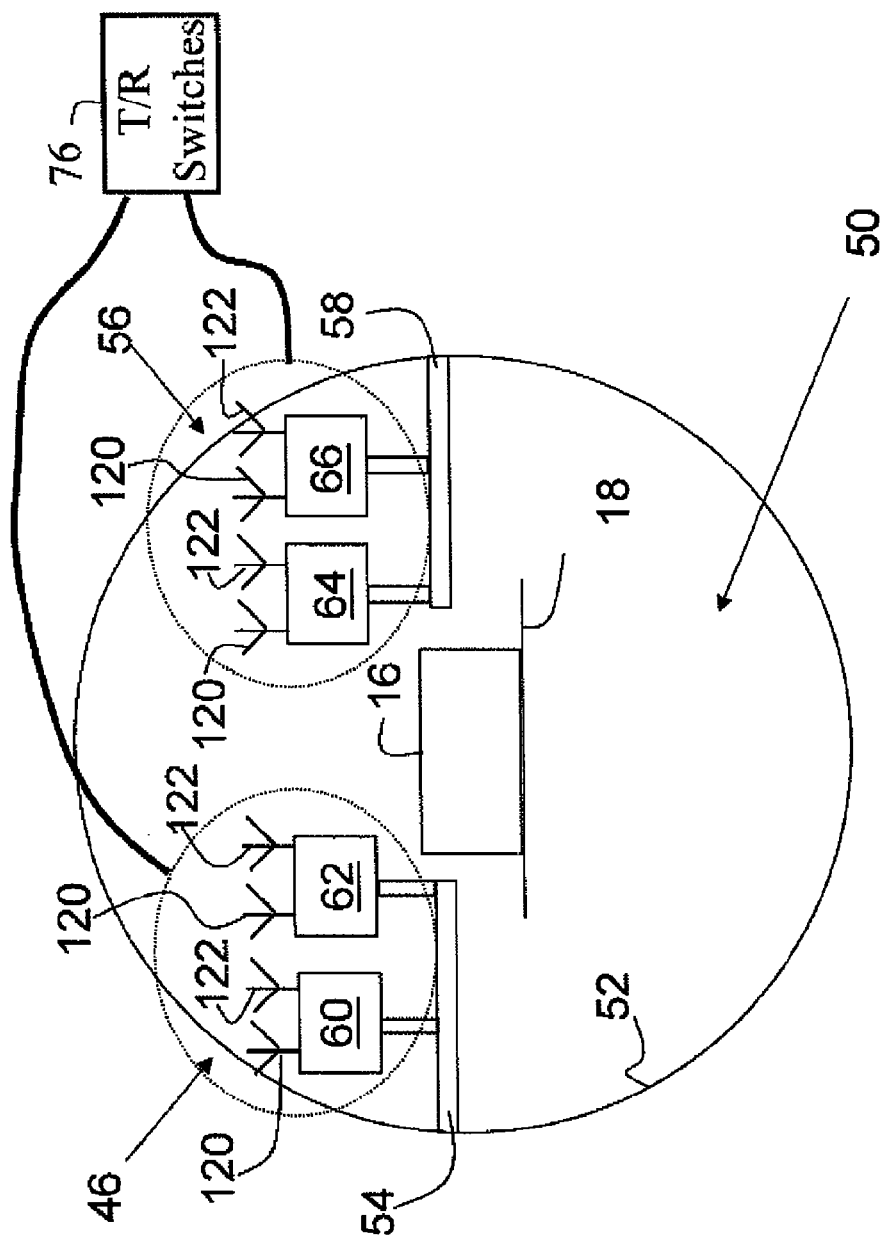
FIG. 2 is a diagrammatic illustration of a front view detail of a magnetic resonance imaging system.
Figure 3:
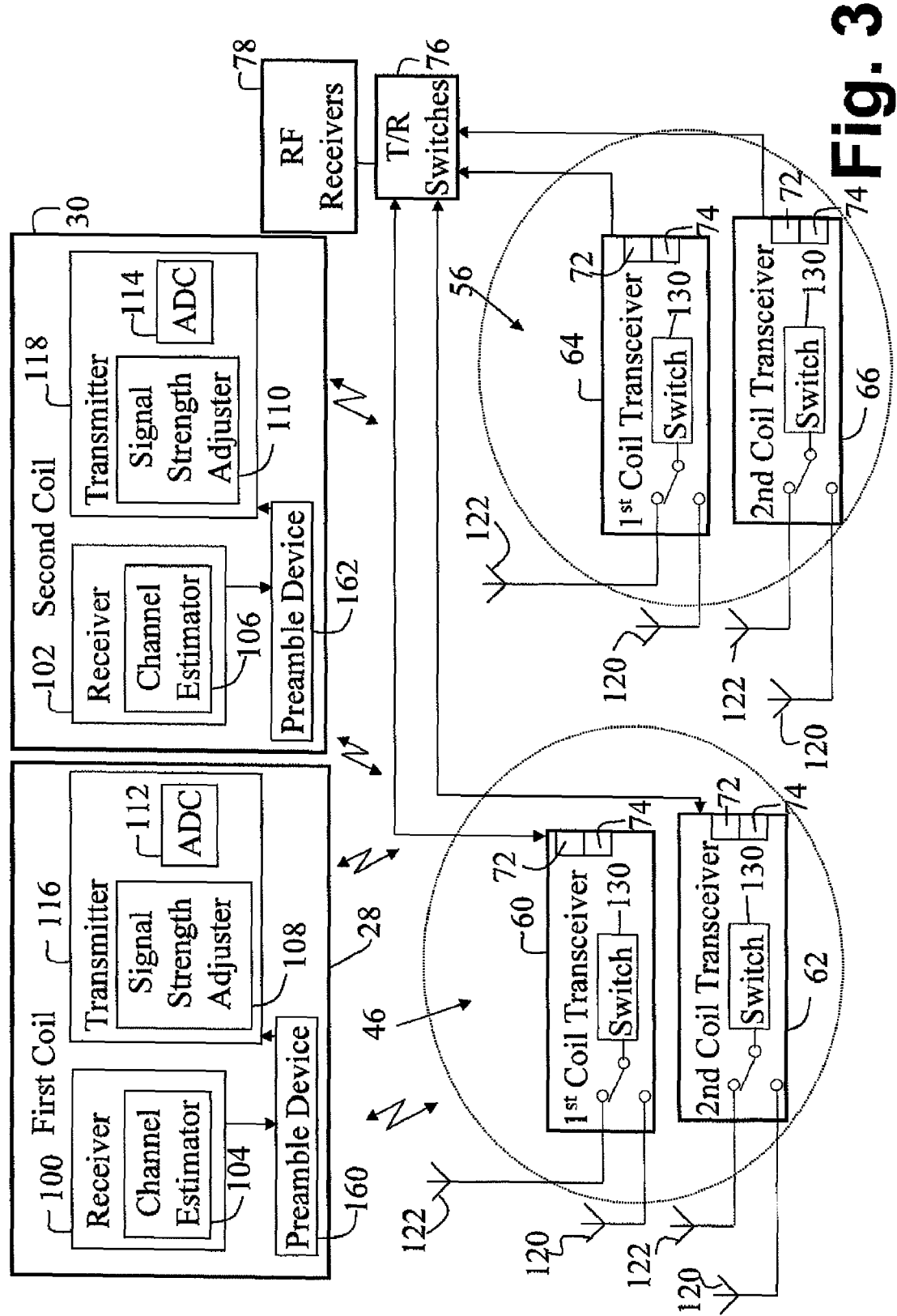
FIG. 3 is a diagrammatic illustration of a detailed portion of a magnetic resonance system.

With continuing reference to FIG. 1 and further reference to FIGS. 2 and 3, at least a first communication location or point 46 is disposed about the examination region 14. In the exemplary embodiment, the first communication location 46 is disposed at about 10:30 about a middle section 48 of a bore 50, which defines the examination region 14, and secured to a bore barrel 52 by a first mounting mechanism or means 54. A second communication location or point 56 is disposed about 1:30 about the middle section 48 of the bore 50 and secured to the bore barrel 52 via a second mounting mechanism or means 58. Of course, other locations in or adjacent the bore 50 are contemplated. Each location 46, 56 includes a transceiver or transceivers. In the exemplary embodiment, each location 46, 56 includes two transceivers 60, 62; 64, 66 each including a receiver 72 and a transmitter 74. For example, the transceiver 60 of the first communication location 46 and the transceiver 64 of the second communication location 56 wirelessly communicate with the first coil 28, while the transceiver 62 of the first communication location 46 and the transceiver 66 of the second communication location 56 wirelessly communicate with the second coil 30. The transceivers 60, 62, 64, 66 are coupled via a transmit/receive switch or switches 76 for each corresponding radio frequency transmitting channel 44.

The radio frequency excitation pulses excite magnetic resonance signals in the imaging subject 16 that are spatially encoded by the selected magnetic field gradients. Further, the imaging controller 40 operates radio frequency receivers or receiving channels 78 coupled with the coil elements 32 via the transceivers at the first and second locations and the transmit/receive switches 76 to demodulate the wirelessly received and spatially encoded magnetic resonance signals received by each coil element. The received spatially encoded magnetic resonance data is stored in a magnetic resonance (MR) data memory 80.

A reconstruction processor, algorithm, device, or other means 82 reconstructs the stored magnetic resonance data into a reconstructed image of the imaging subject 16 or a selected portion thereof lying within the examination region 14. The reconstruction processor 82 employs a Fourier transform reconstruction technique or other suitable reconstruction technique that comports with the spatial encoding used in the data acquisition and, in the illustrated SENSE embodiment, a SENSE unfolding algorithm. The reconstructed image is stored in an image memory 84, and can be displayed on a user interface 86, transmitted over a local area network or the Internet, printed by a printer, or otherwise utilized. In the illustrated embodiment, the user interface 86 also enables a radiologist or other user to interface with the imaging controller 40 to select, modify, or execute imaging sequences. In other embodiments, separate user interfaces are provided for operating the scanner 10 and for displaying or otherwise manipulating the reconstructed images.

The described magnetic resonance imaging system 8 is an illustrative example. In general, substantially any magnetic resonance imaging scanner can incorporate multiple element radio frequency coils. For example, the scanner can be an open magnet scanner, a vertical bore scanner, a low-field scanner, a high-field scanner, or so forth.

With continuing reference to FIG. 3, in a calibration mode, a first (second) receiver 100 (102) of a corresponding first (second) coil 28 (30) periodically analyzes a received wide band calibration signal and estimates one or more frequencies at which the received signal is attenuated or amplified due to the frequency selective adding and cancellation as the calibration signal bounces from numerous adjacent reflective surfaces. For example, the calibration signal is a common constant amplitude at every frequency of the ultra wide band. A channel estimator 104 (106) compares the amplitude of the received calibration signal at each frequency with a predetermined threshold and determines the frequencies at which the signal is strongest, e.g. determines the signals whose strengths are above the threshold and by how much. The threshold can, for example, be set to correspond to the frequency component of the calibration signal with the lowest amplitude. Since the calibrated signal received by the first (second) receiver 100 (102) is a low rate data, the channel estimator 104 (106) can provide accurate characteristics of the signal along the current signal path. A first (second) signal strength adjuster, adjusting algorithm, device, or means 108 (110) reduces an amount of amplification for the frequencies with the stronger signals. For example, the signal amplification or strength of the stronger signal frequencies is reduced by 10 dB. As another example, the amplification at each frequency can be reduced in inverse proportion to the corresponding received signal strength. As another example, the amplification can be increased or decreased as needed to bring all frequencies to a common strength. Because the transmission distances are short, the common strength can be relatively low. Once the signal strength of the stronger signals is reduced, the gain of an analog to digital converter 112 (114) can be set such that the known weaker signals match the range of the analog to digital converters. A first (second) transmitter 116 (118) of a corresponding first (second) coil 28 (30) transmits a series of signals with the amplitude of each frequency adjusted or reduced according to the determined attenuation such that the wide band signal received by the transceivers 60, 64; 62, 66 has substantially the same amplitude range for each frequency. In this manner, the ultra wide band transmit power is compensated to eliminate frequency selective fading. The calibration is repeated periodically, e.g. about every millisecond. Although carrier frequencies about 2.4 GHz are preferred, any frequency above 500 MHz is acceptable. Frequencies below 500 MHz might interfere with the resonance signals and the RF signals used for excitation and manipulation, especially in higher field systems.

The preceding describes conveying received resonance signals from each coil element 32 with ultra wide band communication signals to the bore mounted transceivers 60, 62, 64, 66. Once the signals are received at the transceivers, the signals can be communicated by wire, optically, infrared, retransmitted with wide band technology to a receiver at the edge of the shielded room, or the like. Of course, it is contemplated that the analog to digital conversion can take place at the transceivers side.

The same technique can be used to convey RF excitation and manipulation signals from the transceivers to the local coil elements. Transmitters for generating the RF excitation and manipulation pulses into the subject and a power supply can be mounted in the attenuation factors for the ultra wide band transmitters in the transducer are adjusted as described above.

With continuing reference to FIG. 3, each transceiver 60, 62, 64, 66 is operationally coupled to first and second antennas 120, 122. A diversity switch 130 of each transceiver 60, 62, 64, 66 selects connection to one of the first and second antenna to provide a diversity reception and transmission. For example, a diversity decision is made based on a quality of the received signal which is sought for on the same antenna which performed the transmission. In another embodiment, the signals from the two antennas are combined.

With reference to FIG. 4, a preamble 148 is used at the beginning (e.g. before a data portion 150) of each transmitted data packet 152 to allow the receivers to synchronize with the transmitters. Depending upon the media quality, transmission parameters and transmission length, the standard preamble length (24 symbols) is reduced. Based on the analysis on the received signal, a preamble device, algorithm, mechanism, or means 160, 162 selects a length of preamble, for example, as 12 symbols, e.g. down 12 symbols from preamble standard 24 symbols. In another embodiment, the preamble device 160, 162 selects the length of the preamble as 6 symbols, e.g. 18 symbols down from preamble standard 24 symbols. Of course, it is contemplated that the length of the preamble can be any number of symbols between 6 and 12. In this manner, by reducing the standard preamble size by at least 12 symbols, the broadcasting is performed nearly continually and the system throughput is not compromised. In one embodiment, the short preambles are inserted into the data stream for a quick resynchronization.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance system comprising:
   at least one radio frequency coil assembly disposed within an examination region, with each radio frequency coil assembly being located within the examination region:
   at least one coil element which at least receives magnetic resonance signals from a subject in the examination region,
   an on-board analog to digital converter which digitizes the coil magnetic resonance signals,
   an on-board receiver which wirelessly receives a spread spectrum calibration signals from a wireless transceiver;
   an on-board transmitter which wirelessly transmits the digitized magnetic resonance signals on the multiple channels transceiver on multiple channels at different frequencies in spread spectrum data signals to the wireless transceiver,
   an on-board channel estimator which estimates relative signal strength characteristics on the multiple channels of the spread spectrum based on the received calibration signal from the wireless transceiver and
   an on-board signal strength adjuster which adjusts strengths the data signals based on the signal characteristics of the calibration signal received by the on-board receiver.

2. A magnetic resonance system comprising:
   at least one radio frequency coil disposed within an examination region to receive magnetic resonance data from the examination region, the radio frequency coil including:
   an on-board receiver which wirelessly receives calibration signals in a plurality of frequency bands of a spread spectrum from an associated wireless transceiver and an on-board transmitter which wirelessly transmits multiple channels of the magnetic resonance data in a plurality of frequency bands of the spread spectrum to the associated wireless transceiver;
   an on-board channel estimator programmed to:
      compare strengths of the calibration signals received in each of the plurality of frequencies bands of the spread spectrum with a predetermined signal strength; and
      based on the comparison, determine frequency bands of the spread spectrum with stronger and weaker signal reception,
   an on-board signal strength adjuster which makes a frequency band dependent adjustment to the magnetic resonance data signals strengths such that the magnetic resonance data signals transmitted by the transmitter in the plurality of frequency bands of the spread spectrum are compensated based on the frequency bands of the spread spectrum determined from the received calibration signal to have stronger and weaker signal reception.

3. The system as set forth in claim 2, wherein the signal strength adjuster is programmed to perform one of the following:
   reduce strengths of the data signals transmitted on the spread spectrum frequency bonds determined to have stronger reception;
   reduce amplification of each spread spectrum frequency band in inverse proportion to the corresponding reception strength of the spread spectrum frequency band; and
   increase or decrease the amplification to bring the frequency bands to a common reception strength.

4. The system as set forth in claim 1, wherein the calibration signal has a common amplitude in all the frequency bands of the spread spectrum calibration signal.

5. The system as set forth in claim 1, further including:
   a plurality of the wireless transceivers disposed at least first and second communication points around the examination region.

6. The system as set forth in claim 5, further including:
at least two of the radio frequency coils both disposed in the examination region concurrently; and
at least two of the transceivers located at each of the communication points such that a first of the transceivers at each communication point wirelessly transmits the calibration signal to and receives the compensated signal data from a first coil and a second of the transceivers at each communication point wirelessly transmits the calibration signal to and receives the compensated data signal from a second coil.

7. The system as set forth in claim 5, wherein each transceiver includes:
associated first and second companion antennas for diversity reception/transmission.

8. The system as set forth in claim 1, wherein the calibration signal and the data signal are ultra wide band (UWB) signals.

9. The system as set forth in claim 2, further including:
a preamble device which adjusts a size of a preamble of each of a plurality of data packets transmitted on each spread spectrum frequency band based on the determined reception strength of the corresponding frequency band.

10. The system as set forth in claim 9, wherein the preamble size is adjusted between 6 and 12 symbols.

11. A magnetic resonance imaging method comprising:
on-board an actual RF coil in an MRI examination region wirelessly receiving a spread spectrum calibration signal on a plurality of spread spectrum frequency bands at a radio frequency coil from an associated wireless transceiver;
on-board the actual RF coil in an MRI examination region estimating spread spectrum frequency band dependent signal strength characteristics based on the spread spectrum calibration signal-transmitted from the associated wireless transceiver to the coil;
on-board the actual RF coil in an MRI examination region based on the estimate, adjusting signal strengths data signals to be transmitted in the spread spectrum frequency bands which data signals carry magnetic resonance data acquired in an examination region and
on-board the actual RF coil in an MRI examination region transmitting the signal strength adjusted data signals on the spread spectrum frequency bands to the associated wireless transceiver.

12. The method as set forth in claim 11, wherein the step of estimating includes:
comparing the strengths of the received calibration signal on each of the plurality of spread spectrum frequency bands with a selected signal strength;
based on the comparison, determining spread spectrum frequency bands with stronger and weaker signal reception; and
reducing data signal strengths of the spread spectrum frequency bands determined to have stronger signal reception.

13. The method as set forth in claim 12, wherein the step of transmitting includes:
transmitting the signal strength adjusted data signals to the associated wireless transceiver absent selective frequency fading effects.

14. The method as set forth in claim 11, wherein the calibration signals and the data signals are ultra wide band (UWB) signals.

15. The method as set forth in claim 14, further including:
associating first and second transceivers with each of a plurality of communication points around the imaging region;
disposing at least a first and a second of MR coils in the examination region;
wirelessly transmitting the spread spectrum calibration signal from at least one first transceiver to a first receiver on the first MR coil;
wirelessly transmitting the spread spectrum calibration signal from at least one second transceiver to a second receiver on the second MR coil;
wirelessly receiving the signal strength adjusted data signals from a first transmitter on the first MR coil with the at least one first transceiver; and
wirelessly receiving the signal strength adjusted data signals from a second transmitter on the second MR coil with the at least one second transceiver.

16. The method as set forth in claim 15, wherein each transceiver includes associated first and second companion antennas and further including:
selecting among the antennas for diversity reception/transmission.

17. The method as set forth in claim 11, further including:
periodically retransmitting the spread spectrum calibration signals and re-estimating the spread spectrum frequency band dependent signal strength characteristics.

18. The method as set forth in claim 11, further including:
prior to the step of transmitting, adjusting a preamble size of each transmitted data packet;
transmitting the signal strength adjusted data signals with adjusted preambles to the associated wireless transceiver; and
synchronizing a receiver of the wireless transceiver with the adjusted preamble.

19. A magnetic resonance system comprising:
at least one MR coil disposed within an examination region, the coil including:
an on-board receiver which wirelessly receives a spread spectrum calibration signal and
an on-board transmitter which wirelessly transmits spread spectrum data signals including data packets to an associated wireless transceiver;
at least one processor programmed to:
estimate signal transmission characteristics based on the calibration signal transmitted between the wireless transceiver and the on-board receiver, and
adjust a preamble of each transmitted data packet based on the estimated signal characteristics such that the size of the preambles is non-constant.

20. The system as set forth in claim 19, further including:
a signal strength adjuster which adjusts signals strengths of the transmitted spread spectrum data such that the transmitted data signals are compensated based on the estimated signal characteristics from the received data calibration signal.

* * * * *